United States Patent
Takahashi

(10) Patent No.: US 11,139,390 B2
(45) Date of Patent: Oct. 5, 2021

(54) BIPOLAR TRANSISTOR

(71) Applicant: Murata Manufacturing Co., Ltd., Kyoto-fu (JP)

(72) Inventor: Shinnosuke Takahashi, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 118 days.

(21) Appl. No.: 16/719,153

(22) Filed: Dec. 18, 2019

(65) Prior Publication Data

US 2020/0203508 A1    Jun. 25, 2020

(30) Foreign Application Priority Data

Dec. 25, 2018    (JP) .............................. JP2018-241230

(51) Int. Cl.
| | |
|---|---|
| *H01L 29/08* | (2006.01) |
| *H01L 29/06* | (2006.01) |
| *H01L 29/732* | (2006.01) |
| *H01L 29/10* | (2006.01) |

(52) U.S. Cl.
CPC ........ *H01L 29/732* (2013.01); *H01L 29/0804* (2013.01); *H01L 29/0817* (2013.01); *H01L 29/1004* (2013.01)

(58) Field of Classification Search
CPC .............. H01L 29/732; H01L 29/0804; H01L 29/0817; H01L 29/1004
USPC ........................................ 257/586
See application file for complete search history.

(56) References Cited

U.S. PATENT DOCUMENTS

| | | | |
|---|---|---|---|
| 2005/0151159 A1* | 7/2005 | Ma ....................... | H01L 29/7378 257/152 |
| 2005/0167747 A1 | 8/2005 | Apel et al. | |
| 2018/0240898 A1* | 8/2018 | Tao .................... | H01L 29/42304 |
| 2019/0078941 A1* | 3/2019 | Mahon ................... | H03K 17/14 |

FOREIGN PATENT DOCUMENTS

| | | |
|---|---|---|
| JP | 2003-077930 A | 3/2003 |
| JP | 2007-520086 A | 7/2007 |
| TW | 2005-29428 A | 9/2005 |

OTHER PUBLICATIONS

An Office Action mailed by Taiwan Intellectual Property Office dated Oct. 14, 2020, which corresponds to Taiwanese Patent Application No. 108134050 and is related to U.S. Appl. No. 16/719,153 with English language translation.

* cited by examiner

*Primary Examiner* — David Vu
*Assistant Examiner* — Brandon C Fox
(74) *Attorney, Agent, or Firm* — Studebaker & Brackett PC

(57) ABSTRACT

An emitter mesa and a base electrode are arranged on a base mesa on a substrate. A base wiring line on the base electrode is connected to the base electrode via base openings. The emitter mesa includes a plurality of emitter fingers having a planar shape that is long in one direction. The emitter fingers include first and second emitter fingers. The base openings are arranged so as to be spaced apart in a longitudinal direction from first end portions of the first emitter fingers and are not arranged in a region obtained by extending the second emitter finger in the longitudinal direction. An end portion of the second emitter finger that is near the base openings protrudes in the longitudinal direction beyond the end portions of the first emitter fingers that are near the base openings.

14 Claims, 12 Drawing Sheets

BIPOLAR TRANSISTOR

CROSS-REFERENCE TO RELATED APPLICATION

This application claims benefit of priority to Japanese Patent Application No. 2018-241230, filed Dec. 25, 2018, the entire content of which is incorporated herein by reference.

BACKGROUND

Technical Field

The present disclosure relates to a bipolar transistor.

Background Art

Heterojunction bipolar transistors (HBT), which are transistors having a high power density, are widely used as devices forming power amplifiers that amplify communication signals of mobile terminals or the like. Various parameters such as a base-collection junction capacitance Cbc and a base resistance Rb affect the characteristics of a HBT. The gain of the HBT can be improved when the base-collection junction capacitance Cbc is reduced, and therefore it is requested that the base-collection junction capacitance Cbc be reduced while maintaining the driving performance.

A maximum oscillation frequency $f_{max}$ of a HBT is approximated by the following formula:

[Formula (1)]

$$f_{max} = \sqrt{\frac{f_t}{8\pi \cdot Rb \cdot Cbc}} \quad (1)$$

Here, $f_t$ is a cut-off frequency and Rb is a base resistance. As is clear from Formula (1), in order to improve the maximum oscillation frequency $f_{max}$, it is desirable to not only reduce the base-collection junction capacitance Cbc but also to reduce the base resistance Rb.

Japanese Unexamined Patent Application Publication (Translation of PCT Application) 2007-520086 discloses a HBT that is configured to reduce the base resistance Rb and the base-collection junction capacitance Cbc. In the HBT, a base contact region, where a base electrode contacts a base layer, has a fishbone shape and an emitter region is disposed so as be adjacent to the base contact region and surround the base contact region in a plan view.

In the HBT disclosed in Japanese Unexamined Patent Application Publication (Translation of PCT Application) 2007-520086, the emitter region is disposed so as to surround the fishbone-shaped base contact region from almost all directions (up, down, left, and right) in a plan view. The edge of the emitter region includes an inner edge that is disposed adjacent to the base contact region and an outer edge that is located further toward the outside. The part of the emitter region near the outer edge is spaced apart from the base contact region, and therefore the base resistance Rb is larger close to the outer edge. Since the outer edge of the emitter region is arranged on all sides of the base contact region, the proportion of the emitter region where the base resistance Rb is large increases. As a result, the effect of reducing the base resistance Rb is diminished and the maximum oscillation frequency $f_{max}$ illustrated in Formula (1) is not sufficiently improved.

SUMMARY

Accordingly, the present disclosure is to provide a bipolar transistor that is suitable for reducing a base resistance and a base-collector junction capacitance and can improve performance in a radio-frequency region.

A preferred embodiment of the present disclosure provides a bipolar transistor that includes a substantially mesa-shaped base mesa that is arranged on a substrate and includes semiconductor layers that form a collector and a base; a substantially mesa-shaped emitter mesa that is arranged on the base mesa and defines, in a plan view, an emitter region that operates as an emitter; a base electrode that is arranged so as to not overlap the emitter mesa in a plan view and that is ohmically connected to the base; an insulating film that covers the base electrode and in which at least one base opening is provided that is arranged inside the base electrode in a plan view; and a base wiring line that is arranged on the insulating film and is connected to the base electrode via the base opening.

The emitter mesa includes a plurality of emitter fingers that have a planar shape that is long in one direction and the emitter fingers are arranged side by side in a lateral direction, which is perpendicular to longitudinal directions of the emitter fingers, so that the longitudinal directions of the emitter fingers are parallel to each other. The emitter fingers include at least one first emitter finger and at least one second emitter finger. The base electrode includes at least one first base electrode portion that is arranged between the first emitter finger and the second emitter finger and is long in the longitudinal direction and at least one second base electrode portion that is arranged so as to be spaced apart in the longitudinal direction from one end portion of the first emitter finger.

The base opening is arranged so as to be spaced apart in the longitudinal direction from the one end portion of the first emitter finger and is not arranged in a region obtained by extending the second emitter finger in the longitudinal direction in a plan view. An end portion of the second emitter finger that is near the base opening protrudes in the longitudinal direction beyond the end portion of the first emitter finger that is near the base opening.

In the bipolar transistor according to the preferred embodiment of the present disclosure, the base opening is not arranged in a region that would be obtained by extending the second emitter finger in the longitudinal direction and the second emitter finger is made to protrude in the longitudinal direction further than the side of the first emitter finger near the base opening. Consequently, the area of the emitter mesa can be increased without increasing the area of the base mesa. As a result, the base-collector junction capacitance can be substantially reduced. Furthermore, an increase in base resistance can be suppressed by arranging the first base electrode portion between the first emitter finger and the second emitter finger.

Other features, elements, characteristics and advantages of the present disclosure will become more apparent from the following detailed description of preferred embodiments of the present disclosure with reference to the attached drawings.

DETAILED DESCRIPTION

First Embodiment

A bipolar transistor according to a first embodiment will be described while referring to FIGS. 1 to 3.

Figure 1:
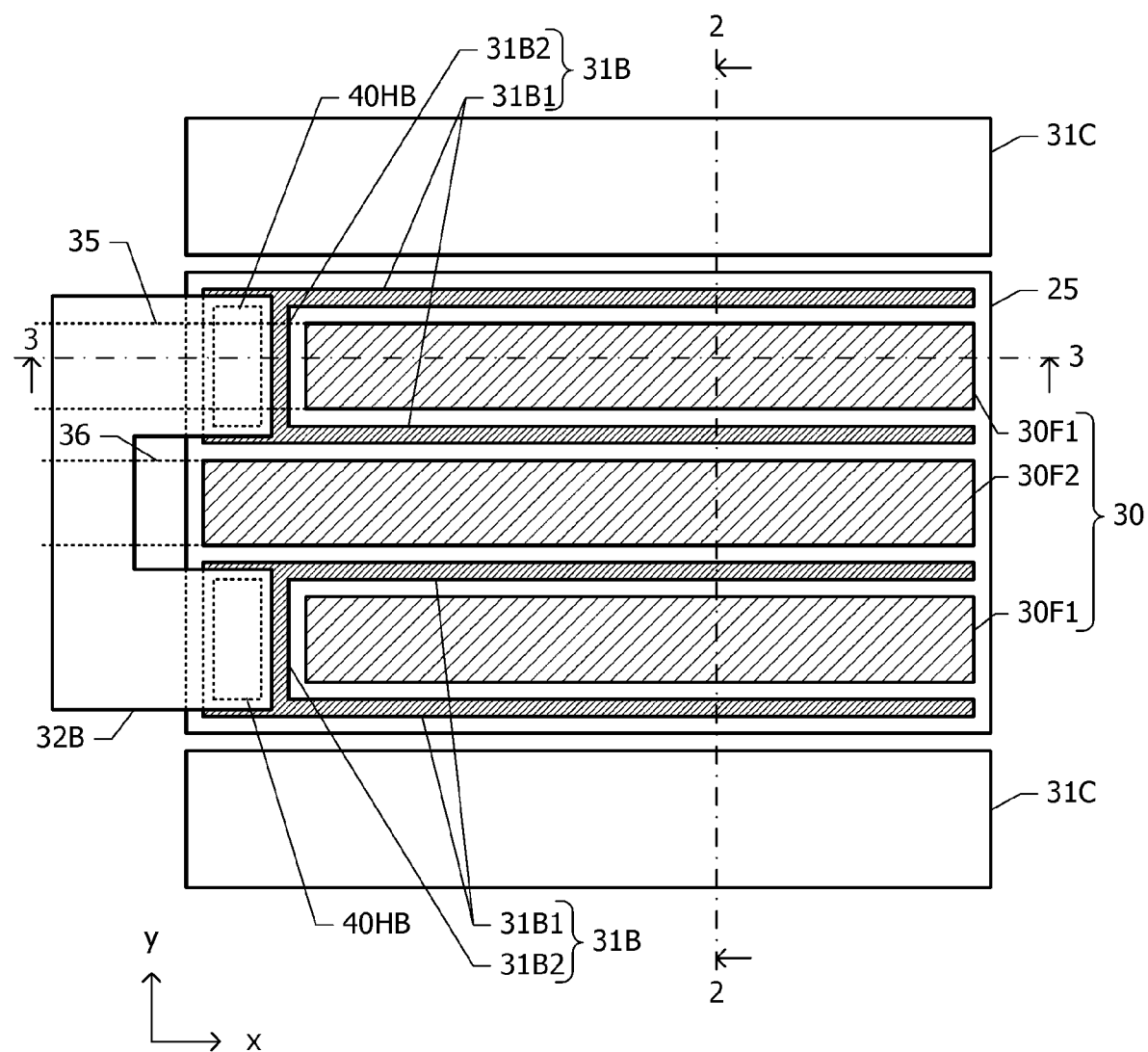
FIG. 1 is a diagram illustrating the planar positional relationship between the constituent elements of a bipolar transistor according to a first embodiment.

FIG. 1 is a diagram illustrating the planar positional relationship between the constituent elements of a bipolar transistor according to the first embodiment. A substantially mesa-shaped base mesa 25 is arranged on a substrate composed of a semiconductor. The planar shape of the base mesa 25 is substantially rectangular, for example. The base mesa 25 includes semiconductor layers that respectively function as a collector and a base of the bipolar transistor.

A substantially mesa-shaped emitter mesa 30 is formed on the base mesa 25 so as to be inside the base mesa 25 in a plan view. In FIG. 1, the emitter mesa 30 is shaded with hatching. The emitter mesa 30 defines an emitter region that operates as the emitter of the bipolar transistor as will be described later with reference to FIGS. 2 and 3.

The emitter mesa 30 consists of two first emitter fingers 30F1 and one second emitter finger 30F2 that are long in a direction parallel to a surface of the substrate. The first emitter fingers 30F1 and the second emitter finger 30F2 are arranged side by side in a lateral direction that is perpendicular to a longitudinal direction so that the longitudinal directions thereof are parallel to each other, and the second emitter finger 30F2 is arranged between the two first emitter fingers 30F1. An xy Cartesian coordinate system is defined in which the longitudinal direction is an x-axis direction and the lateral direction is a y-axis direction.

Base electrodes 31B, which are ohmically connected to the base of the bipolar transistor, are arranged inside the base mesa 25 so as not to overlap the emitter mesa 30 in a plan view. In FIG. 1, the base electrodes 31B are shaded with darker hatching than the emitter mesa 30. The base electrodes 31B include four first base electrode portions 31B1 that are long in the x-axis direction and two second base electrode portions 31B2. Two of the first base electrode portions 31B1 are arranged between the first emitter fingers 30F1 and the second emitter finger 30F2. The remaining two first base electrode portions 31B1 are arranged outside the two first emitter fingers 30F1 on the outermost sides in the y-axis direction.

The two second base electrode portions 31B2 are arranged so as to be spaced apart in the x-axis direction from negative x-axis side (left side in FIG. 1) end portions of the two first emitter fingers 30F1. The second base electrode portions 31B2 are each connected to negative x-axis side end portions of the two first base electrode portions 31B1, which are arranged on both sides of the corresponding first emitter finger 30F1. One second base electrode portion 31B2 and two first base electrode portions 31B1 connected thereto surround each first emitter finger 30F1 from three sides (positive and negative y-axis sides and negative x-axis side).

An insulating film is arranged so as to cover the first emitter fingers 30F1, the second emitter finger 30F2, and the base electrodes 31B. Base openings 40HB, which are arranged inside the two second base electrode portions 31B2 in a plan view, are formed in the insulating film. Base wiring lines 32B are arranged on the insulating film. The base wiring lines 32B are connected to the base electrodes 31B via the two base openings 40HB and extend out toward the negative x-axis side to outside the base mesa 25. In addition, the base wiring lines 32B, which extend from the two base openings 40HB, are connected to each other outside the base mesa 25.

Collector electrodes 31C are arranged on both sides of the base mesa 25 in the y-axis direction. The collector electrodes 31C ohmically contact a sub collector layer arranged on the surface of the substrate and are connected to the collector included in the base mesa 25 via the sub collector layer.

First virtual extension regions 35, which are obtained by virtually extending the first emitter fingers 30F1 toward the negative x-axis side, and the base openings 40HB partially overlap. In contrast, a second virtual extension region 36, which is obtained by virtually extending the second emitter finger 30F2 toward the negative x-axis side, does not overlap the base openings 40HB. An end portion of the second emitter finger 30F2 on the negative x-axis side extends further toward the negative x-axis side than end portions of the first emitter fingers 30F1 on the negative x-axis side. The second emitter finger 30F2 is preferably configured to extend toward the negative x-axis side up to a position that would overlap the base openings 40HB if the second emitter finger 30F2 were virtually moved in the y-axis direction in a translational manner.

Figure 2:
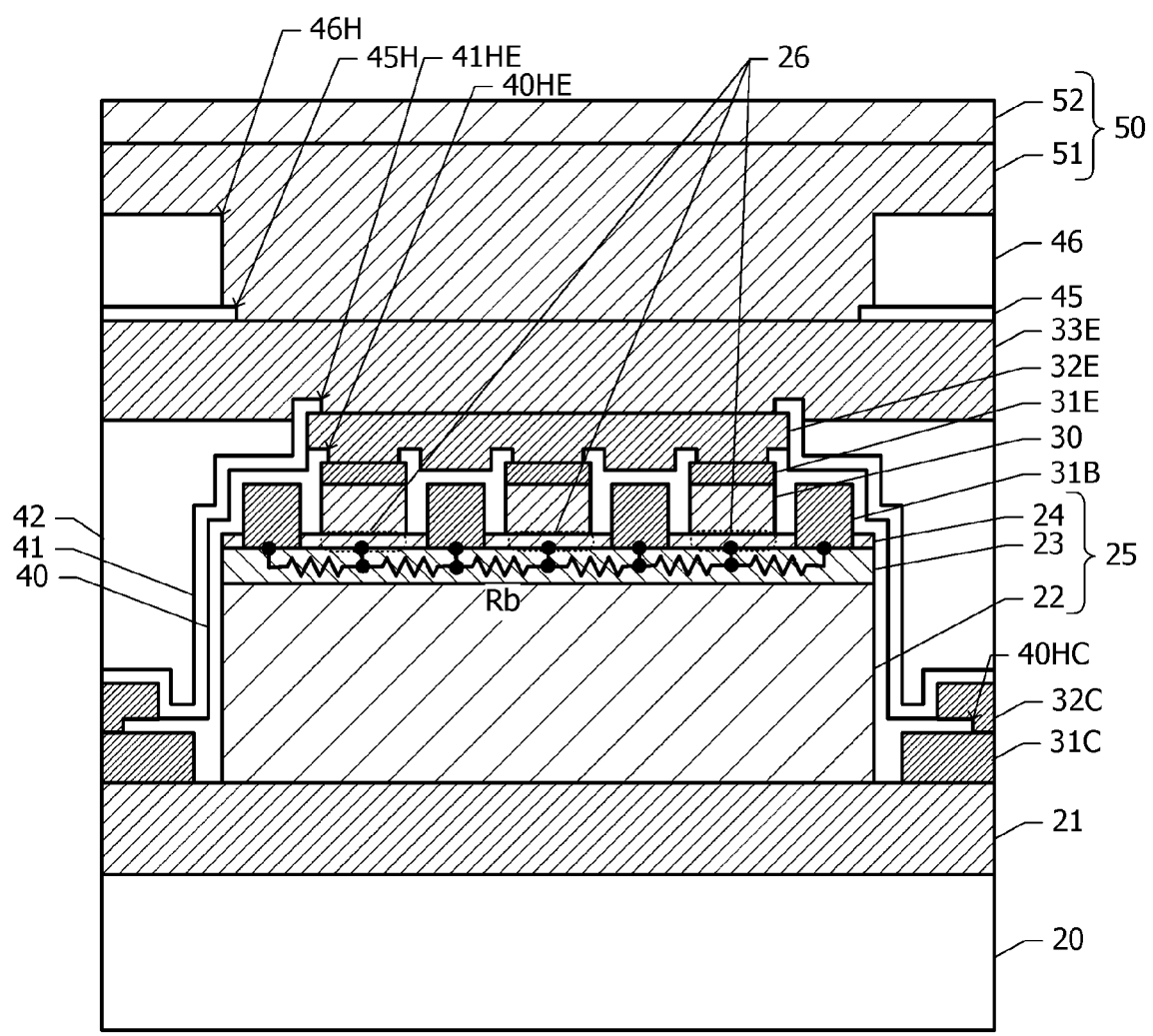
FIG. 2 is a sectional view taken along a one-dot chain line 2-2 in FIG. 1.
Figure 3:
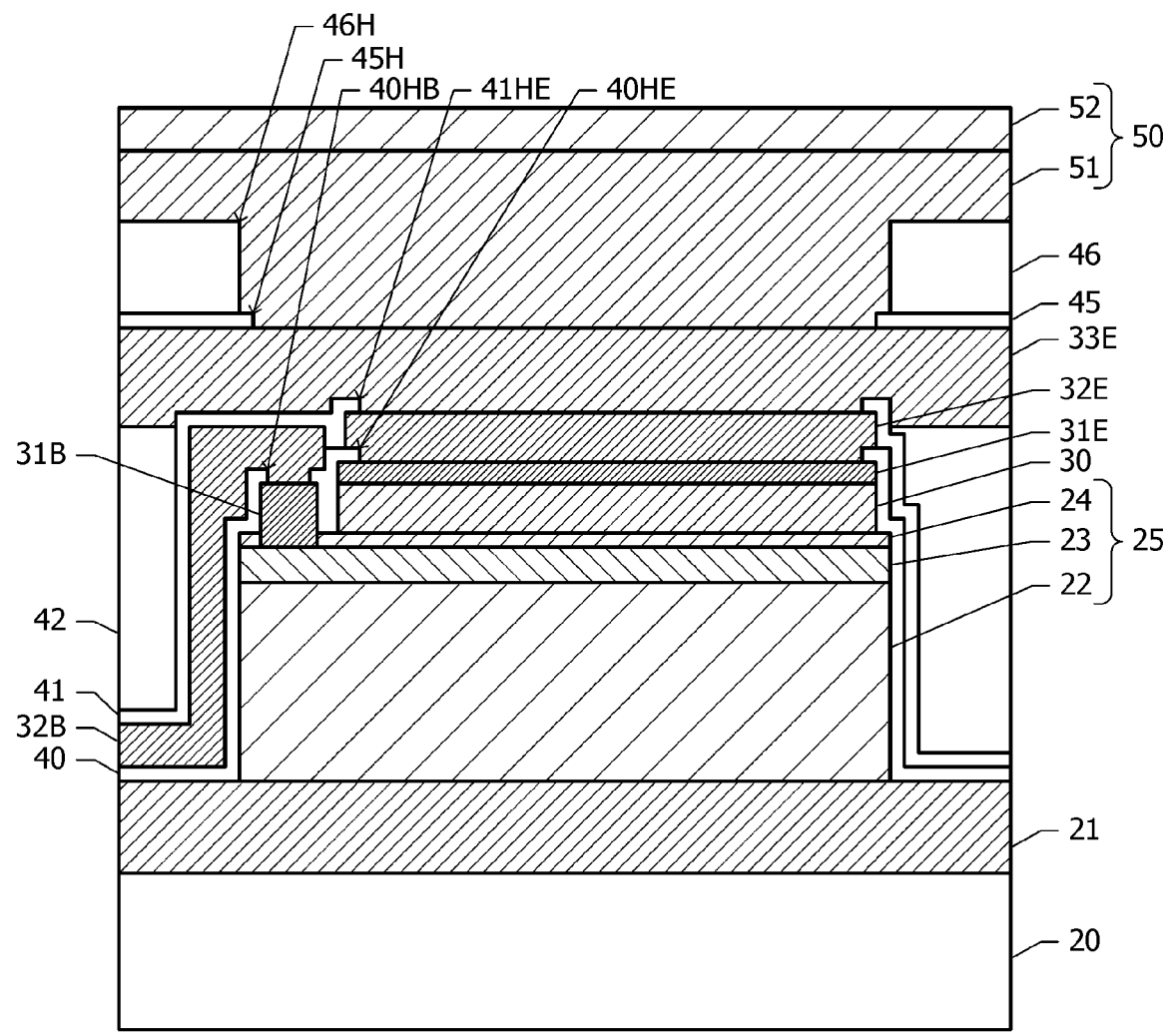
FIG. 3 is a sectional view taken along a one-dot chain line 3-3 in FIG. 1.

FIGS. 2 and 3 are sectional views respectively taken along the one-dot chain line 2-2 and the one-dot chain line 3-3 in FIG. 1. The semiconductor element structure illustrated in FIGS. 2 and 3 can be formed using a known semiconductor process.

A sub collector layer 21 is arranged on a substrate 20 that is composed of a semiconductor such as GaAs. The base mesa 25 is arranged on a partial area of the sub collector layer 21. The base mesa 25 has a multilayer structure in with a collector layer 22, a base layer 23, and an emitter layer 24 are sequentially stacked on top of one another from the side close to the substrate.

The collector electrodes 31C are arranged on the sub collector layer 21 on both sides of the base mesa 25 in a cross section perpendicular to the x-axis (FIG. 2). The collector electrodes 31C ohmically contact the sub collector layer 21 and are connected to the collector layer 22 via the sub collector layer 21.

The emitter mesa 30, which is composed of a semiconductor layer, is arranged on a partial area of the base mesa 25. The emitter mesa 30 and emitter layer 24, which has a region that overlaps the emitter mesa 30 in a plan view, function as the emitter of the bipolar transistor. A region of the emitter layer 24 that overlaps the emitter mesa 30 in a plan view will be referred to as an emitter region 26. The region of the emitter layer 24 that does not overlap the emitter mesa 30 is depleted. Thus, the emitter region 26 of the bipolar transistor is defined by the emitter mesa 30.

The base electrodes 31B are arranged on a partial area of the base mesa 25. The base electrodes 31B ohmically contact the base layer 23 via openings provided in the emitter layer 24. The base electrodes 31B are formed on the emitter layer 24 and the base electrodes 31B are ohmically connected to the base layer 23 by performing an alloying process.

The sub collector layer 21 and the collector layer 22 are formed of n-type GaAs, the base layer 23 is formed of p-type GaAs, and the emitter layer 24 is formed of n-type InGaP. The emitter mesa 30 is formed of two layers consisting of an n-type GaAs layer and an n-type InGaAs layer, for example. The collector layer 22, the base layer 23, the emitter layer 24, and the emitter mesa 30 form a heterojunction bipolar transistor (HBT).

An emitter electrode 31E is arranged on the emitter mesa 30. The emitter electrode 31E ohmically contacts the emitter mesa 30 and is connected to the emitter region 26.

An insulating film 40 is arranged so as to cover the base electrodes 31B, the emitter electrode 31E, the collector electrodes 31C, the base mesa 25, and the emitter mesa 30. For example, silicon nitride (SiN) is used as the insulating film 40. The base openings 40HB through which the second base electrode portions 31B2 of the base electrodes 31B (FIG. 1) are exposed and an emitter opening 40HE through which the emitter electrode 31E is exposed are provided in the insulating film 40.

The base wiring lines 32B, a collector wiring line 32C, and an emitter wiring line 32E of a first layer are arranged on the insulating film 40. The base wiring lines 32B are connected to the base electrodes 31B via the base openings 40HB and the emitter wiring line 32E is connected to the emitter electrode 31E via the emitter opening 40HE. The collector wiring line 32C is connected to the collector electrodes 31C via a collector opening 40HC provided in the insulating film 40.

An insulating film 41 is arranged so as to cover the base wiring lines 32B and the emitter wiring line 32E of the first layer. An organic insulating film 42 is arranged so as to bury a low region that is outside the region where the base mesa 25 is arranged. For example, SiN is used for the insulating film 41 and polyimide, benzocyclobutene or the like is used for the organic insulating film 42. An emitter opening 41HE through which the emitter wiring line 32E of the first layer is exposed is formed in the insulating film 41.

An emitter wiring line 33E of a second layer is arranged on the insulating film 41 and the organic insulating film 42. The emitter wiring line 33E is connected to the emitter wiring line 32E of the first layer via the emitter opening 41HE. A protective film 45 and an organic protective film 46 are formed on the emitter wiring line 33E. For example, SiN is used for the protective film 45 and polyimide, benzocyclobutene or the like is used for the organic protective film 46. Openings 45H and 46H are formed in bump forming regions of the protective film 45 and the organic protective film 46.

A bump 50 is arranged on the emitter wiring line 33E exposed inside the openings 45H and 46H. The bump 50 extends up to part of the upper surface of the organic protective film 46. The bump 50 includes a pillar 51 and a solder layer 52 formed on the pillar 51, for example. The pillar 51 is formed of copper (Cu), for example.

A base resistance Rb (FIG. 2) is formed between the emitter region 26 and the base electrodes 31B. A base-collector junction capacitance Cbc is proportional to the area of the base mesa 25 in a plan view. When the area of the emitter mesa 30 is increased with respect to the base mesa 25, driving performance is improved without a change in the base-collector junction capacitance Cbc, and therefore the same effect is obtained as when the base-collector junction capacitance Cbc is substantially reduced.

Next, advantageous effects of the first embodiment will be described while referring to FIGS. 1 and 4.

Figure 4:
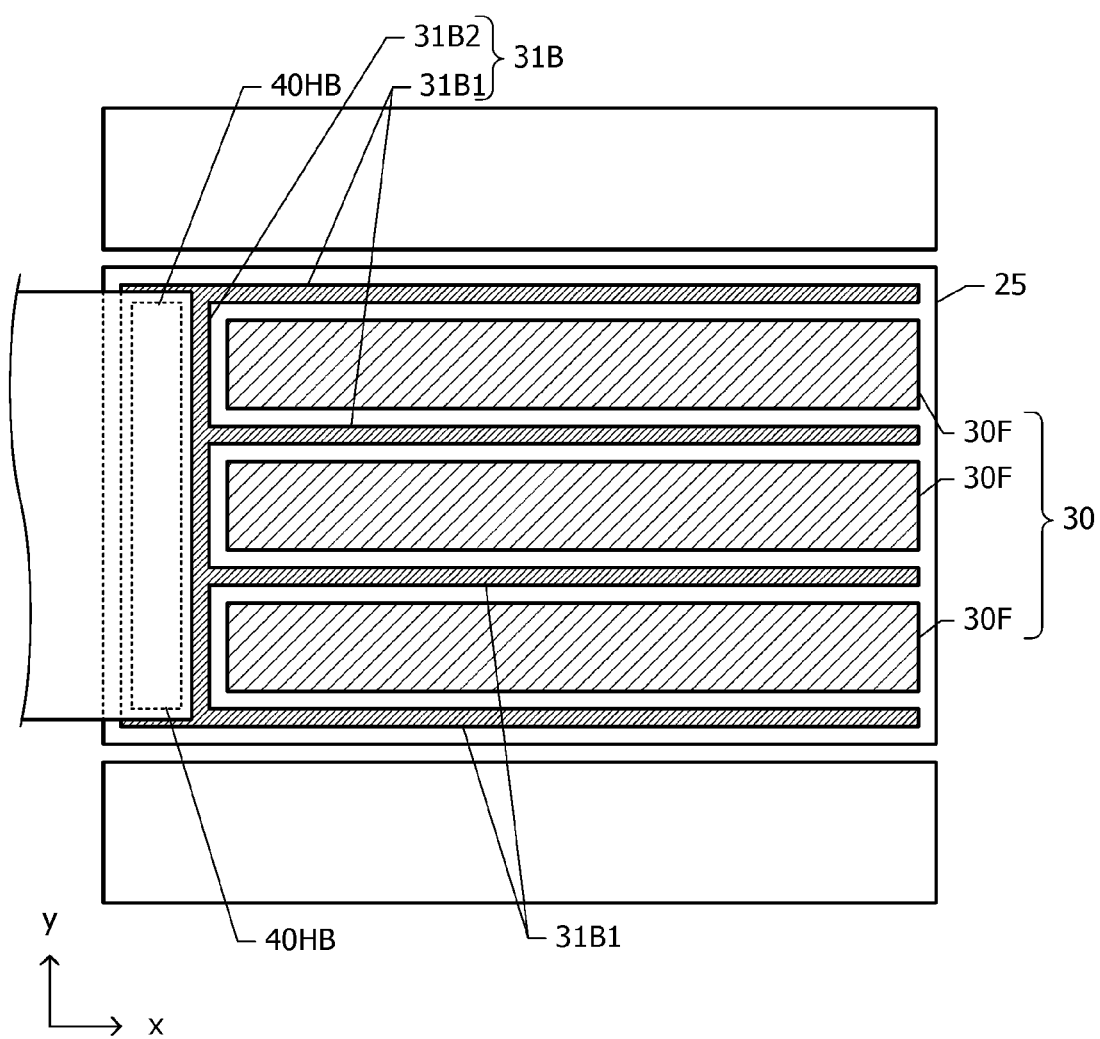
FIG. 4 is a diagram illustrating the planar positional relationship between the constituent elements of a bipolar transistor according to a comparative example.

FIG. 4 is a diagram illustrating the planar positional relationship between the constituent elements of a bipolar transistor according to a comparative example. In the comparative example, a second base electrode portion 31B2 is arranged so as to extend from a first base electrode portion 31B1 arranged at one end thereof to a first base electrode portion 31B1 arranged at the other end thereof. Virtual extension regions, which are obtained by virtually extending three emitter fingers 30F toward the negative x-axis side, partially overlap a base opening 40HB in all of the emitter fingers 30F. Therefore, the emitter fingers 30F cannot be extended up to a position where the base opening 40HB is arranged in the y-axis direction.

In the first embodiment illustrated in FIG. 1, the base openings 40HB are not arranged in the second virtual extension region 36 obtained by virtually extending the second emitter finger 30F2 toward the negative x-axis side and the second base electrode portions 31B2 are also not arranged in the second virtual extension region 36. In addition, an end portion of the second emitter finger 30F2 on the negative x-axis side protrudes further toward the negative x-axis side than the end portions of the first emitter fingers 30F1 on the negative x-axis side. Therefore, compared with the comparative example (FIG. 4), the area of the emitter mesa 30 can be increased while maintaining the size of the base mesa 25 constant. Thus, the base-collector junction capacitance Cbc can be substantially reduced.

In order to realize a sufficient effect of reducing the base-collector junction capacitance Cbc, it is preferable that the length of the second emitter finger 30F2 (x-axis direction dimension) be made as large as possible under the condition that the second emitter finger 30F2 fits inside the base mesa 25. For example, it is preferable that the end portion of the second emitter finger 30F2 on the negative x-axis side be extended up to a point so as to overlap a position where the base openings 40HB are arranged with respect to the x-axis direction.

Furthermore, in the first embodiment, the first base electrode portions 31B1 are arranged on both sides of the first emitter fingers 30F1 and the second emitter finger 30F2 in the lateral direction (y-axis direction). Therefore, the base resistance Rb can be reduced compared with the configuration in which the emitter mesa 30 is arranged so as to surround the peripheries of the base electrodes 31B.

It is preferable that the first base electrode portions 31B1 be arranged so as to extend along the entire length of the first emitter fingers 30F1 in the longitudinal direction (x-axis direction) in order to obtain a sufficient effect of reducing the base resistance Rb. In addition, it is preferable that the first base electrode portions 31B1 and the second base electrode portions 31B2 be arranged so as to extend along the entire length of the second emitter finger 30F2 in the longitudinal direction (x-axis direction).

In the first embodiment, the radio-frequency characteristics of the bipolar transistor can be improved by reducing the base-collector junction capacitance Cbc compared with the comparative example (FIG. 4).

Next, modifications of the first embodiment will be described.

In the first embodiment, two first emitter fingers 30F1 and one second emitter finger 30F2 are arranged inside one base mesa 25 in a plan view, but alternatively a plurality of first emitter fingers 30F1 and a plurality of second emitter fingers 30F2 may be arranged in an alternating manner in the y-axis direction. The first emitter fingers 30F1 are preferably arranged on the outermost sides in the y-axis direction. For example, three first emitter fingers 30F1 and second emitter fingers 30F2 disposed between the adjacent first emitter fingers 30F1 are preferably arranged. In this case, three base openings 40HB would be arranged inside one base mesa 25.

Furthermore, a plurality of emitter fingers may be arranged inside one base mesa 25 in a plan view and at least one of the plurality of the emitter fingers may be a second emitter finger 30F2 and the remaining emitter fingers may be first emitter fingers 30F1. Base openings 40HB corresponding to two first emitter fingers 30F1 that are adjacent to each other in the y-axis direction and between which a second emitter finger 30F2 is not arranged may be connected to each other in the y-axis direction.

In the first embodiment, n-type GaAs is used for the sub collector layer 21 and the collector layer 22, p-type GaAs is used for the base layer 23, and n-type InGaP is used for the emitter layer 24, but other compound semiconductor materials may be used instead. In addition, in the first embodiment, a heterojunction bipolar transistor is exemplified, but the configuration of the first embodiment can also be applied to a normal bipolar transistor that does not include a heterojunction.

Second Embodiment

Next, a bipolar transistor according to a second embodiment will be described while referring to FIGS. 5A, 5B, and 6. Hereafter, description of parts of the configuration that are common to the bipolar transistor according the first embodiment will be omitted.

Figure 5A:
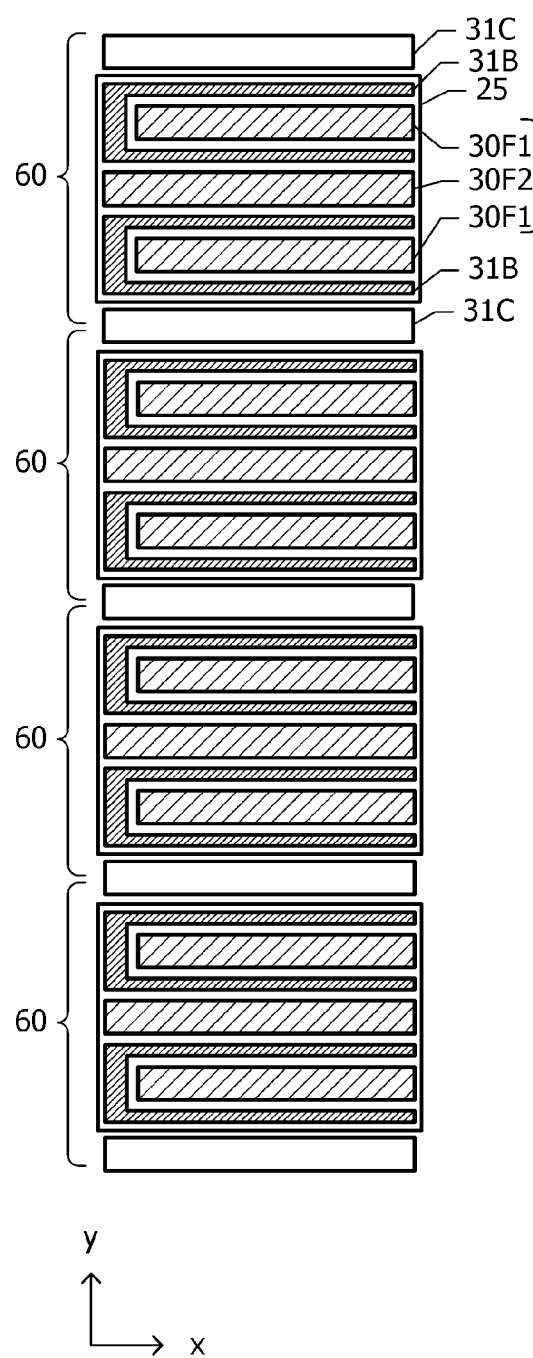
FIGS. 5A and 5B are diagrams illustrating the planar positional relationship between base mesas, emitter mesas, base electrodes, and collector electrodes of bipolar transistors according to a second embodiment and a comparative example.

FIG. 5A is a diagram illustrating the planar positional relationship between base mesas 25, emitter mesas 30, base electrodes 31B, and collector electrodes 31C of the bipolar transistor according to the second embodiment. A plurality of four cell transistors 60 are formed on a normal substrate and are arranged side by side in the y-axis direction. The planar positional relationship between the constituent elements of each cell transistor 60 is identical to the planar positional relationship between the constituent elements of the bipolar transistor according to the first embodiment (FIG. 1). In other words, one cell transistor 60 includes two first emitter fingers 30F1 and one second emitter finger 30F2. In addition, a collector electrode 31C disposed between two base mesas 25 that are adjacent to each other in the y-axis direction is shared by two cell transistors 60. The four cell transistors 60 are connected in parallel with each other.

Figure 5B:
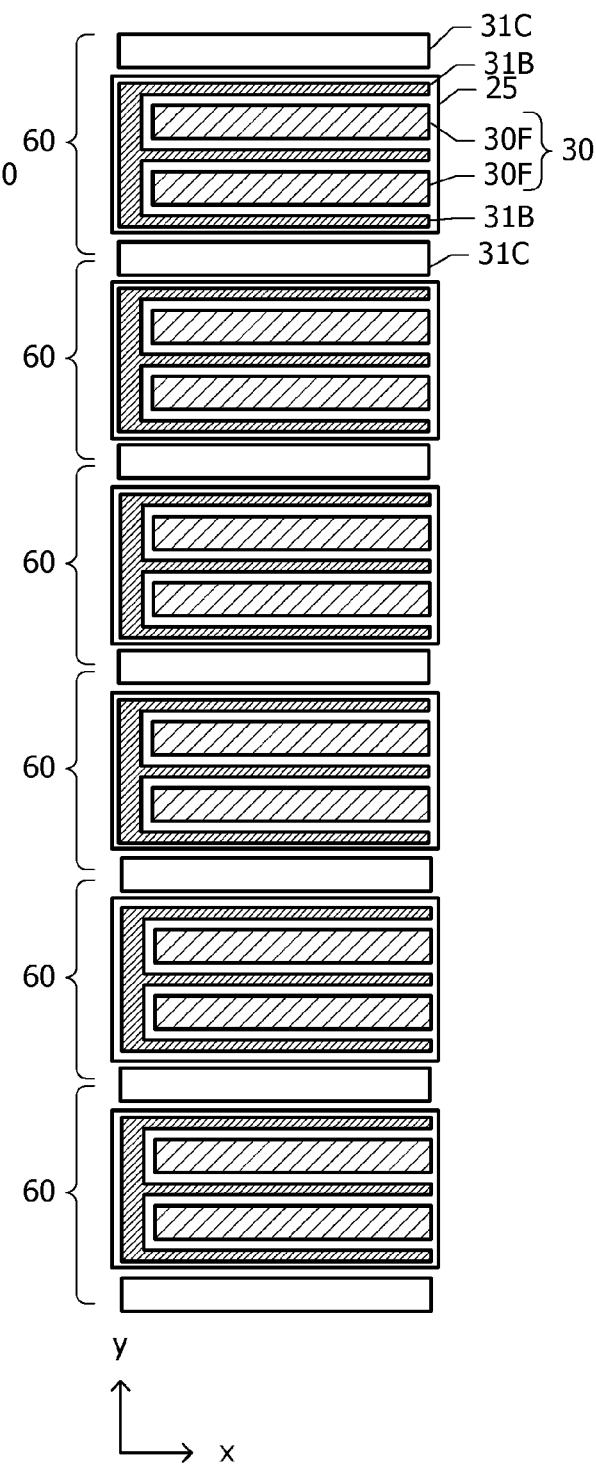

FIG. 5B is a diagram illustrating the planar positional relationship between base mesas 25, emitter mesas 30, base electrodes 31B, and collector electrodes 31C of a bipolar transistor according to a comparative example. In the comparative example, two emitter mesas 30 are arranged inside one base mesa 25. Six cell transistors 60 are connected in parallel with each other in order to obtain an equivalent driving performance to that of the bipolar transistor according to the second embodiment, and consequently the total number of emitter fingers 30F is the same as in the second embodiment illustrated in FIG. 5A.

Next, the advantageous effects of the second embodiment (FIG. 5A) will be described while making comparison to the comparative example (FIG. 5B).

In the second embodiment illustrated in FIG. 5A, sixteen first base electrode portions 31B1 of the base electrodes 31B are arranged, whereas in the comparative example illustrated in FIG. 5B, eighteen first base electrode portions 31B1 of the base electrodes 31B are arranged. Even through the number of first base electrode portions 31B1 is smaller in the second embodiment than in the comparative example, the first base electrode portions 31B1 are arranged on both sides of each first emitter finger 30F1 and second emitter finger 30F2. Therefore, a base resistance Rb having the same size as in the comparative example is realized in the second embodiment.

Furthermore, in the second embodiment, since the number of first base electrode portions 31B1 per one emitter finger is smaller, the ratio of the area of the emitter mesa 30 to the area of the base mesa 25 is larger in the second embodiment than in the comparative example. Therefore, in the second embodiment, the base-collector junction capacitance Cbc is substantially reduced compared with the comparative example. In addition, since the configuration according to the first embodiment is used in the second embodiment, the base-collector junction capacitance Cbc can be substantially reduced even more.

Furthermore, in the second embodiment, the number of first base electrode portions 31B1 and collector electrodes 31C is smaller than in the comparative example, and therefore the area occupied by these electrodes on the substrate can be reduced.

Figure 6:
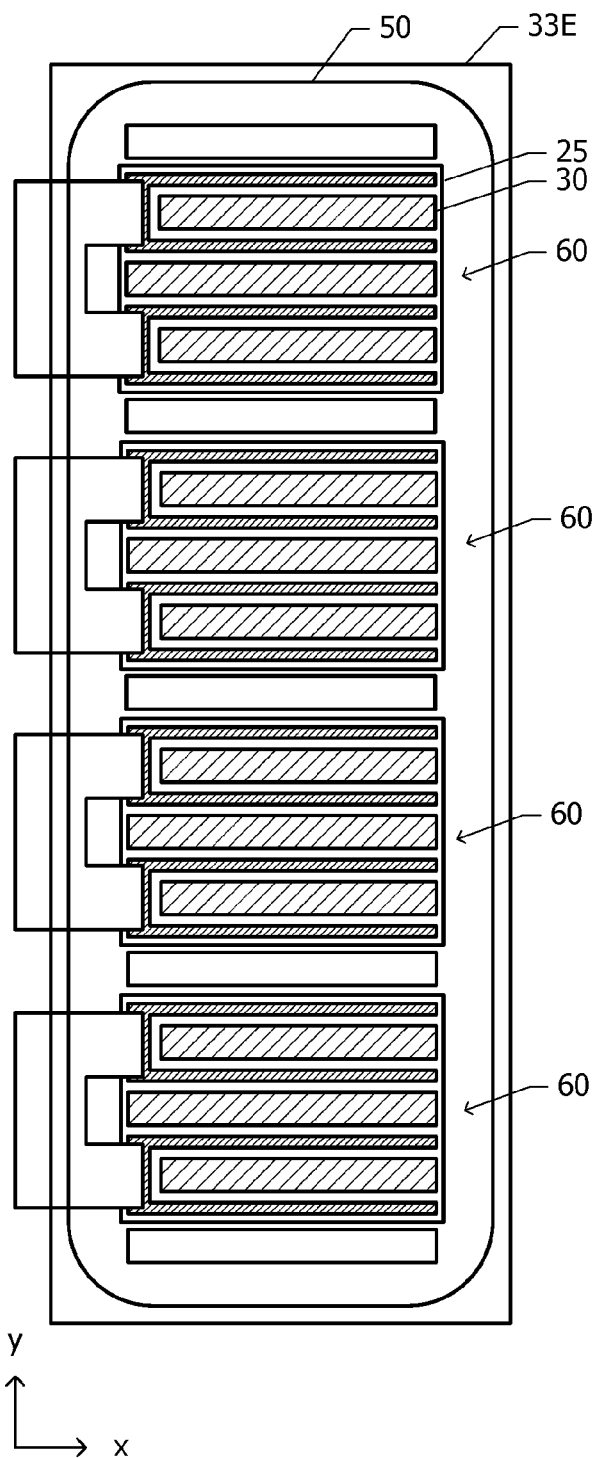
FIG. 6 is a diagram illustrating the planar positional relationship between a plurality of cell transistors, an emitter wiring line, and a bump according to the second embodiment.

FIG. 6 is a diagram illustrating the planar positional relationship between a plurality of cell transistors 60, an emitter wiring line 33E of the second layer, and a bump 50 according to the second embodiment. The emitter wiring line 33E of the second layer (FIGS. 2 and 3) is arranged so as to include all the emitter mesas 30 of the plurality of parallel-connected cell transistors 60. The bump 50 is arranged so as to substantially overlap the emitter wiring line 33E. The bump 50 is arranged so as to extend from one end of the plurality of cell transistors 60, which are arrayed in the y-axis direction, to the other end of the plurality of cell transistors 60, and has a planar shape that is long in the y-axis direction. The substrate 20 (FIGS. 2 and 3) on which the bipolar transistor is formed is mounted face down on a mounting substrate with the surface on which the bump 50 is formed facing the mounting substrate.

When the driving performance of the bipolar transistor is increased by increasing the ratio of the area of the emitter mesa 30 to the area of the base mesa 25, the amount of heat generated by the emitter region 26 (FIG. 2) directly below the emitter mesa 30 is increased. In the second embodiment, the bump 50 is arranged directly above the emitter mesa 30 and the planar shape of the bump 50 is enlarged so as to straddle the plurality of cell transistors 60. Therefore, the heat generated by the emitter region 26, which is a source of heat, can be efficiently radiated to the mounting substrate via the bump 50.

Third Embodiment

Next, a bipolar transistor according to a third embodiment will be described while referring to FIG. 7. Hereafter, description of the parts of the configuration that are common to the bipolar transistor according to the first embodiment (FIGS. 1 to 3) will be omitted.

Figure 7:
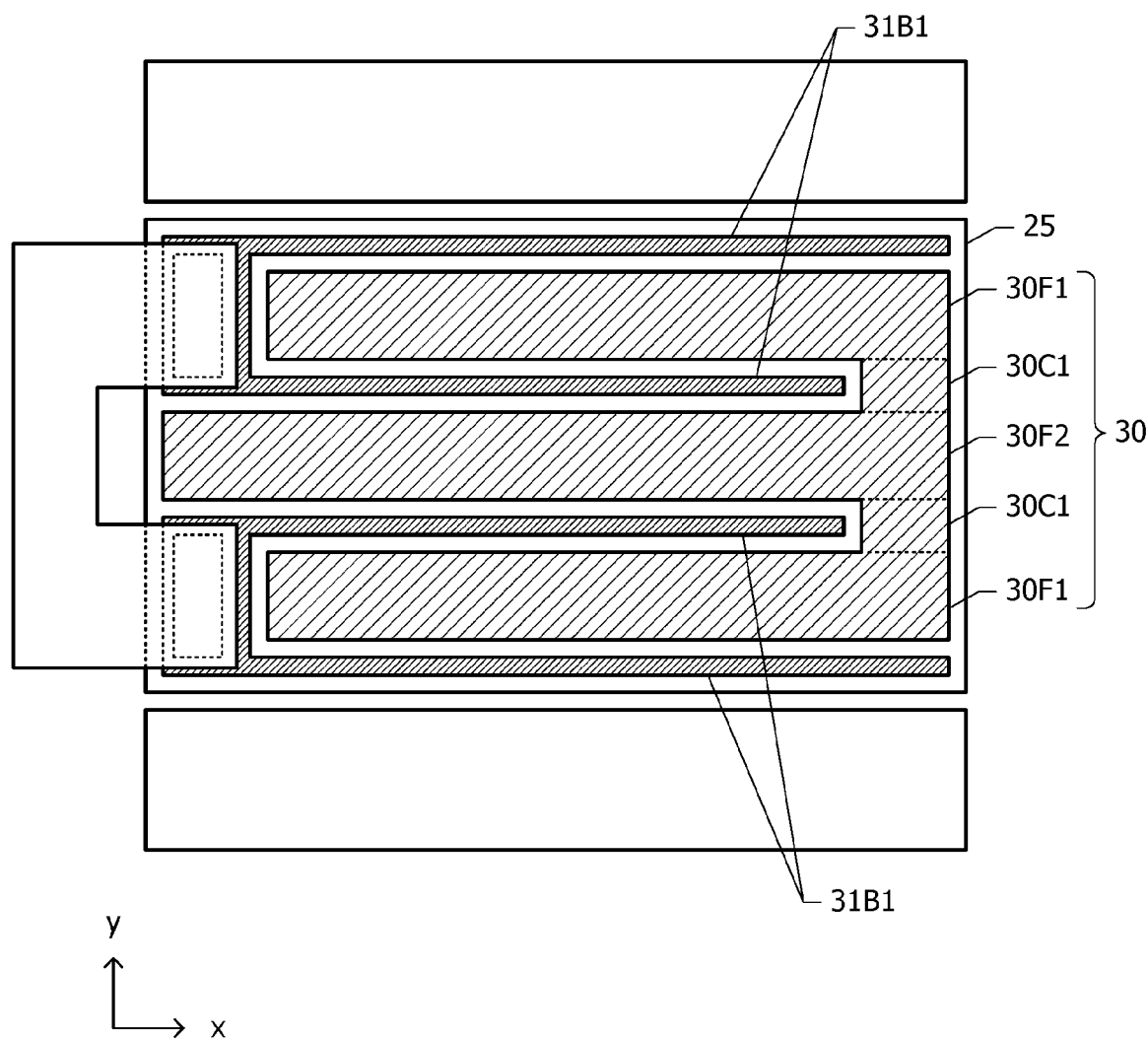
FIG. 7 is a diagram illustrating the planar positional relationship between the constituent elements of a bipolar transistor according to a third embodiment.

FIG. 7 is a diagram illustrating the planar positional relationship between the constituent elements of the bipolar transistor according to the third embodiment. In the first embodiment (FIG. 1), the two first emitter fingers 30F1 and the one second emitter finger 30F2 are separated from each other. In contrast, in the third embodiment, the two first emitter fingers 30F1 and the one second emitter finger 30F2 are connected to each other at the end portions thereof on the positive x-axis side (side that is opposite side where the base openings 40HB are arranged) by emitter connection portions 30C1. The emitter mesa 30 is formed of the two first emitter fingers 30F1, the one second emitter finger 30F2, and the two emitter connection portions 30C1.

The positive x-direction side end portions of the first base electrode portions 31B1, which are arranged between the first emitter fingers 30F1 and the second emitter finger 30F2, are shortened so as not to contact the emitter connection portions 30C1.

Next, advantageous effects of the third embodiment will be described.

In the third embodiment, since the emitter connection portions 30C1 are arranged, the ratio of the area of the emitter mesa 30 to the area of the base mesa 25 is larger than in the first embodiment (FIG. 1). Therefore, the base-collector junction capacitance Cbc can be substantially reduced.

The parts of the emitter connection portions 30C1 and the second emitter finger 30F2 that are close to the edges on the positive x-axis side are far from the first base electrode portions 31B1, and therefore the base resistance Rb is increased with respect to these parts. However, since the first base electrode portions 31B1 are arranged on both sides along the majority of the lengths of the first emitter fingers 30F1 and the second emitter finger 30F2, the increase in the base resistance Rb is small.

Compared with the comparative example illustrated in FIG. 4, it is sufficient that the size of the increase in the maximum oscillation frequency $f_{max}$ resulting from the reduction in the base-collector junction capacitance Cbc be larger than the size of the decrease in the maximum oscillation frequency $f_{max}$ resulting from the increase in the base resistance Rb in order to improve the maximum oscillation frequency $f_{max}$, which is an indicator of radio-frequency performance. For example, if the dimension of the emitter connection portions 30C1 in the x-axis direction is too large, the increase in the base resistance Rb is significant and the effect of improving radio-frequency characteristics is diminished. In order to obtain a sufficient improvement in radio-frequency characteristics, it is preferable that the dimension of the emitter connection portions 30C1 in the x-axis direction be less than or equal to two times the width (dimension in y-axis direction) of the first emitter fingers 30F1.

Fourth Embodiment

Next, a bipolar transistor according to a fourth embodiment will be described while referring to FIG. 8. Hereafter, description of parts of the configuration that are common to the bipolar transistor according the third embodiment (FIG. 7) will be omitted.

Figure 8:
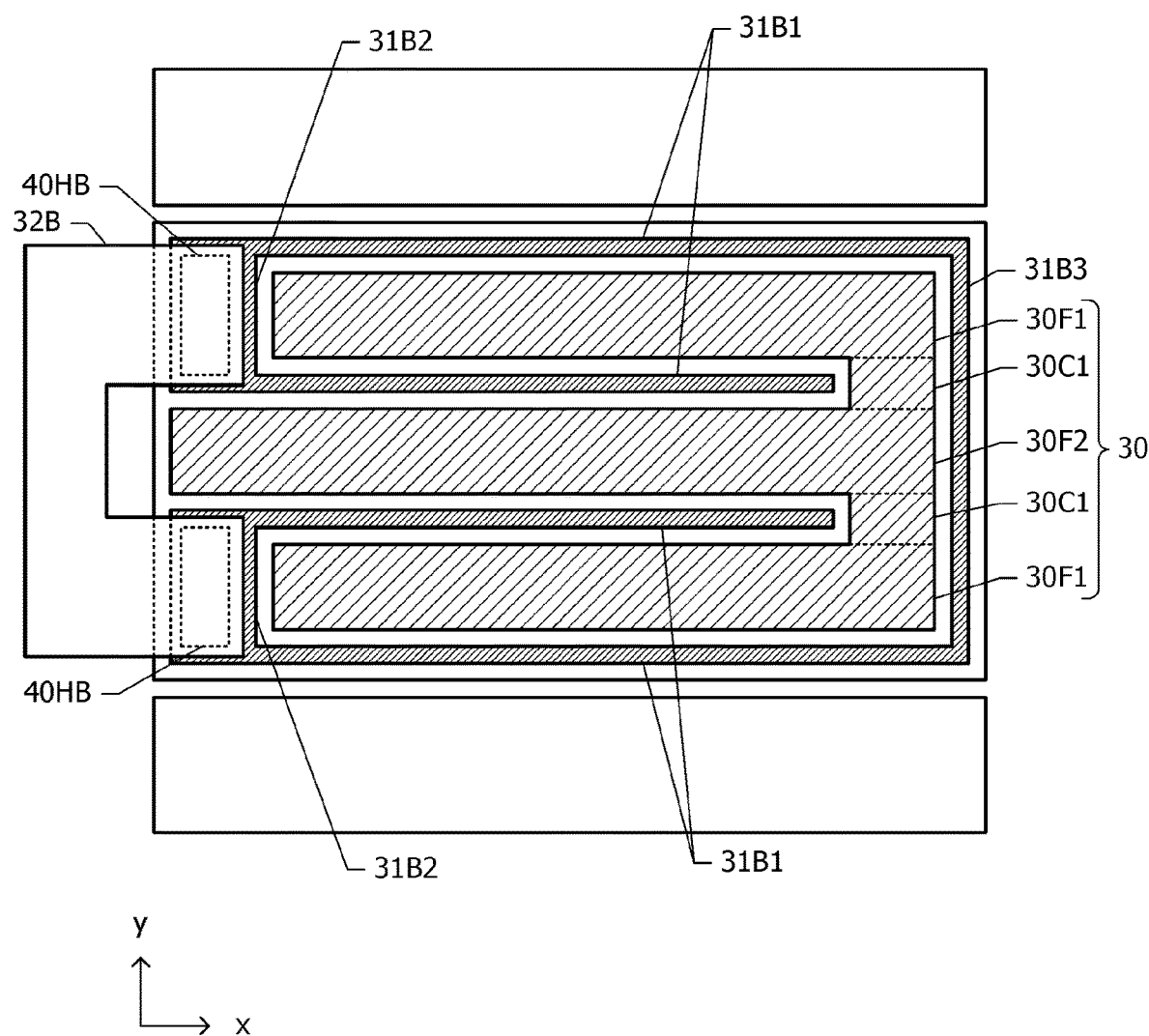
FIG. 8 is a diagram illustrating the planar positional relationship between the constituent elements of a bipolar transistor according to a fourth embodiment.

FIG. 8 is a diagram illustrating the planar positional relationship between the constituent elements of the bipolar transistor according to the fourth embodiment. In the third embodiment, the base electrodes 31B are not arranged on the positive x-axis side of the emitter mesa 30 (FIG. 7). In contrast, in the fourth embodiment, a third base electrode portion 31B3 is arranged that connects to each other the positive x-axis side end portions of the two first base electrode portions 31B1 that are arranged outside the two first emitter fingers 30F1. The third base electrode portion 31B3 is arranged so as to be spaced apart from the positive x-axis side edges of the first emitter fingers 30F1, the second emitter finger 30F2, and the emitter connection portions 30C1 toward the positive x-axis side. The base electrode 31B is formed of four first base electrode portions 31B1, two second base electrode portions 31B2, and one third base electrode portion 31B3.

Next, advantageous effects of the fourth embodiment will be described.

In the fourth embodiment, since the third base electrode portion 31B3 is arranged close to positive x-axis side edges of the first emitter fingers 30F1, the second emitter finger 30F2, and the emitter connection portions 30C1, the base resistance Rb can be reduced compared with the third embodiment. The reduction in the base resistance Rb can contribute to improvement of radio-frequency characteristics.

Next, a modification of the fourth embodiment will be described.

In the fourth embodiment, the base electrode 31B is formed of one continuous planar pattern. Therefore, even if one of the two base openings 40HB were not arranged, an electrical connection between the base electrode 31B and the base wiring lines 32B could still be secured. If a base opening 40HB were omitted, the dimension of the second base electrode portion 31B2 in that part could be reduced. The first emitter finger 30F1 could be extended toward the negative x-axis side in accordance with the decrease in size of the second base electrode portion 31B2. As a result, the base-collector junction capacitance Cbc could be further reduced.

However, in a configuration in which one of the two base openings 40HB is not arranged, there are places inside the base electrode 31B where the current path from the base opening 40HB is long. Therefore, the base resistance Rb is increased due to the electrical resistance of the base electrode 31B. It is preferable to decide whether to retain or omit such a base opening 40HB by comparing the size of the increase in the maximum oscillation frequency $f_{max}$ resulting from the reduction in the base-collector junction capacitance Cbc and the size of the reduction in the maximum oscillation frequency $f_{max}$ resulting from the increase in the base resistance Rb.

Fifth Embodiment

Next, a bipolar transistor according to a fifth embodiment will be described while referring to FIG. 9. Hereafter, description of parts of the configuration that are common to the bipolar transistor according the third embodiment (FIG. 7) will be omitted.

Figure 9:
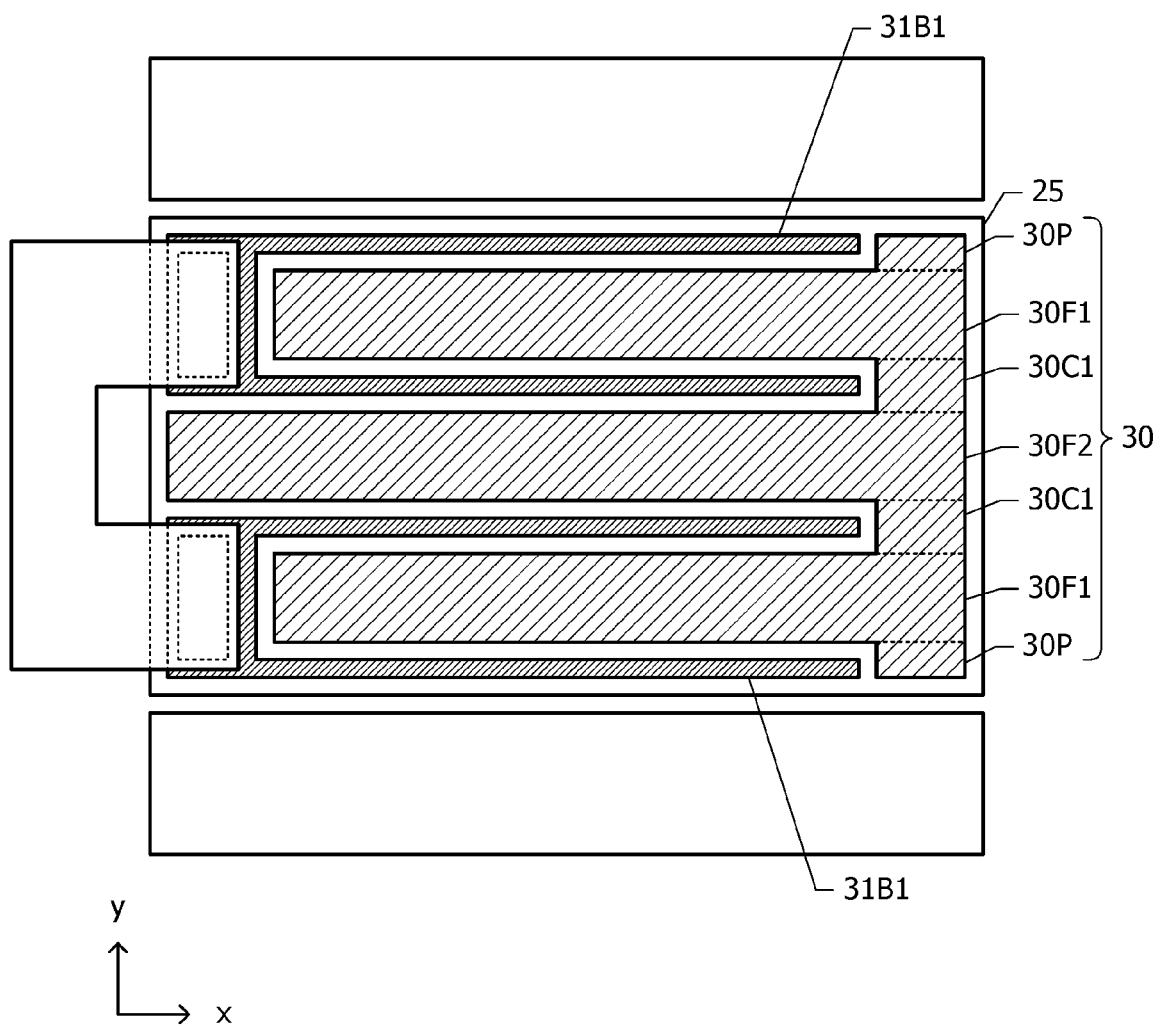
FIG. 9 is a diagram illustrating the planar positional relationship between the constituent elements of a bipolar transistor according to a fifth embodiment.

FIG. 9 is a diagram illustrating the planar positional relationship between the constituent elements of the bipolar transistor according to the fifth embodiment. In the third embodiment, as illustrated in FIG. 7, the first base electrode portions 31B1 arranged outside the first emitter fingers 30F1 are arranged so as to extend along the entire lengths of the first emitter fingers 30F1 in the longitudinal direction. In contrast, in the fifth embodiment, emitter protruding portions 30P are included that protrude in the y-axis direction from the positive x-direction side end portions of two first emitter fingers 30F1. The positive x-axis side end portions of the first base electrode portions 31B1 that are arranged outermost are shortened toward the negative x-axis side so as to not contact the emitter protruding portions 30P. Regions obtained by virtually extending the first base electrode portions 31B1 that are arranged outermost toward the positive x-axis side overlap the emitter protruding portions 30P.

Next, advantageous effects of the fifth embodiment will be described.

Compared with the third embodiment (FIG. 7), in the fifth embodiment, the area of the emitter mesa 30 is increased without changing the area of the base mesa 25. Therefore, the base-collector junction capacitance Cbc can be substantially reduced. In addition, since the first base electrode portions 31B1 are arranged on both sides of the first emitter fingers 30F1 along the majority of the lengths of the first emitter fingers 30F1 in the longitudinal direction (x-axis direction), the size of the increase in the base resistance Rb is small. As a result, the configuration of the fifth embodiment can contribute to improvement of radio-frequency characteristics.

Sixth Embodiment

Next, a bipolar transistor according to a sixth embodiment will be described while referring to FIG. 10. Hereafter, description of the parts of the configuration that are common to the bipolar transistor according to the first embodiment (FIGS. 1 to 3) will be omitted.

Figure 10:
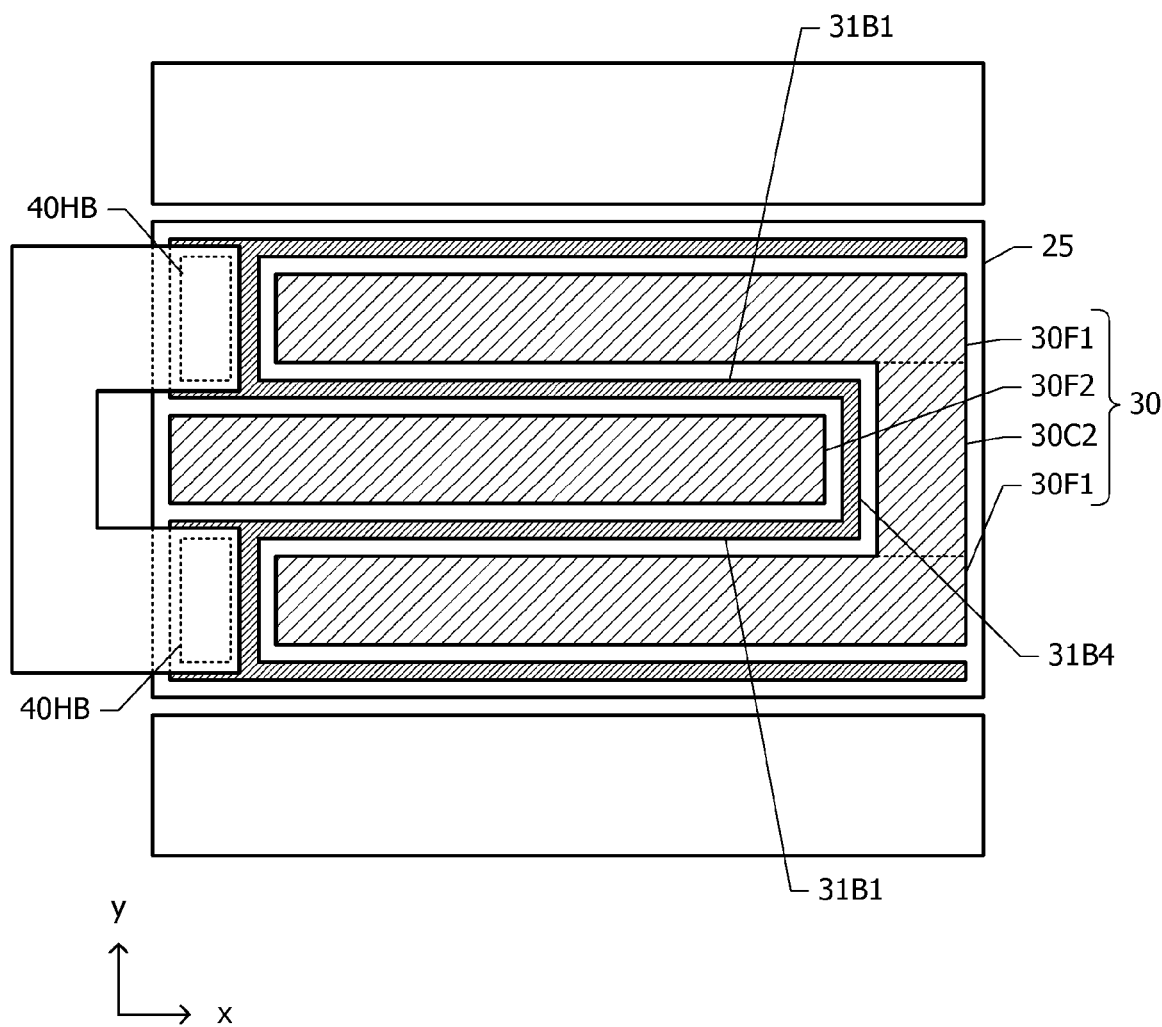
FIG. 10 is a diagram illustrating the planar positional relationship between the constituent elements of a bipolar transistor according to a sixth embodiment.

FIG. 10 is a diagram illustrating the planar positional relationship between the constituent elements of the bipolar transistor according to the sixth embodiment. In the first embodiment, the base electrodes 31B that respectively surround the two first emitter fingers 30F1 from three sides are separated from each other. In contrast, in the sixth embodiment, the two first base electrode portions 31B1 that are arranged on both sides of the second emitter finger 30F2 are connected to each other at the positive x-axis side end portions thereof by a fourth base electrode portion 31B4. The fourth base electrode portion 31B4 is arranged so as to be spaced apart in the x-axis direction from the positive x-axis side end portion of the second emitter finger 30F2.

The positive x-axis side end portions of the two first emitter fingers 30F1 extend toward the positive x-axis side beyond the position at which the fourth base electrode portion 31B4 is arranged. The two first emitter fingers 30F1 are connected to each other by an emitter connection portion 30C2 at a position that is further toward the positive x-axis side than the fourth base electrode portion 31B4. The two first emitter fingers 30F1, the one second emitter finger 30F2, and the emitter connection portion 30C2 form the emitter mesa 30.

Next, advantageous effects of the sixth embodiment will be described.

In the bipolar transistor according to the third embodiment illustrated in FIG. 7, the positive x-axis side end portion of the second emitter finger 30F2 is more greatly spaced apart from the base electrodes 31B than other parts of the emitter mesa 30. Therefore, the base resistance Rb is greater in parts that are close to the positive x-axis side end portion of the second emitter finger 30F2. In the sixth embodiment, since the fourth base electrode portion 31B4 is arranged, the distance from the base electrode 31B to the edge of the emitter connection portion 30C2 on the positive x-axis side is shorter. As a result, an increase in the base resistance Rb can be suppressed.

However, the ratio of the area of the emitter mesa 30 to the area of the base mesa 25 is larger in the bipolar transistor of the third embodiment illustrated in FIG. 7. Therefore, the base-collector junction capacitance Cbc is smaller in the bipolar transistor of the third embodiment.

Thus, the configuration of the third embodiment (FIG. 7) is preferable from the viewpoint of reducing the base-collector junction capacitance Cbc and the configuration of the sixth embodiment is preferable from the viewpoint of suppressing an increase in the base resistance Rb. Whether to adopt the configuration of the third embodiment or the configuration of the sixth embodiment should be decided by considering the contribution of a reduction in the base-collector junction capacitance Cbc and the contribution of a reduction in the base resistance Rb to the increase or decrease of the maximum oscillation frequency $f_{max}$.

Next, a modification of the sixth embodiment will be described.

In the sixth embodiment, since the base electrode 31B is formed one continuous planar pattern, one of the two base openings 40HB may be omitted.

Seventh Embodiment

Next, a bipolar transistor according to a seventh embodiment will be described while referring to FIG. 11. Hereafter, description of parts of the configuration that are common to the bipolar transistor according the third embodiment (FIG. 7) will be omitted.

Figure 11:
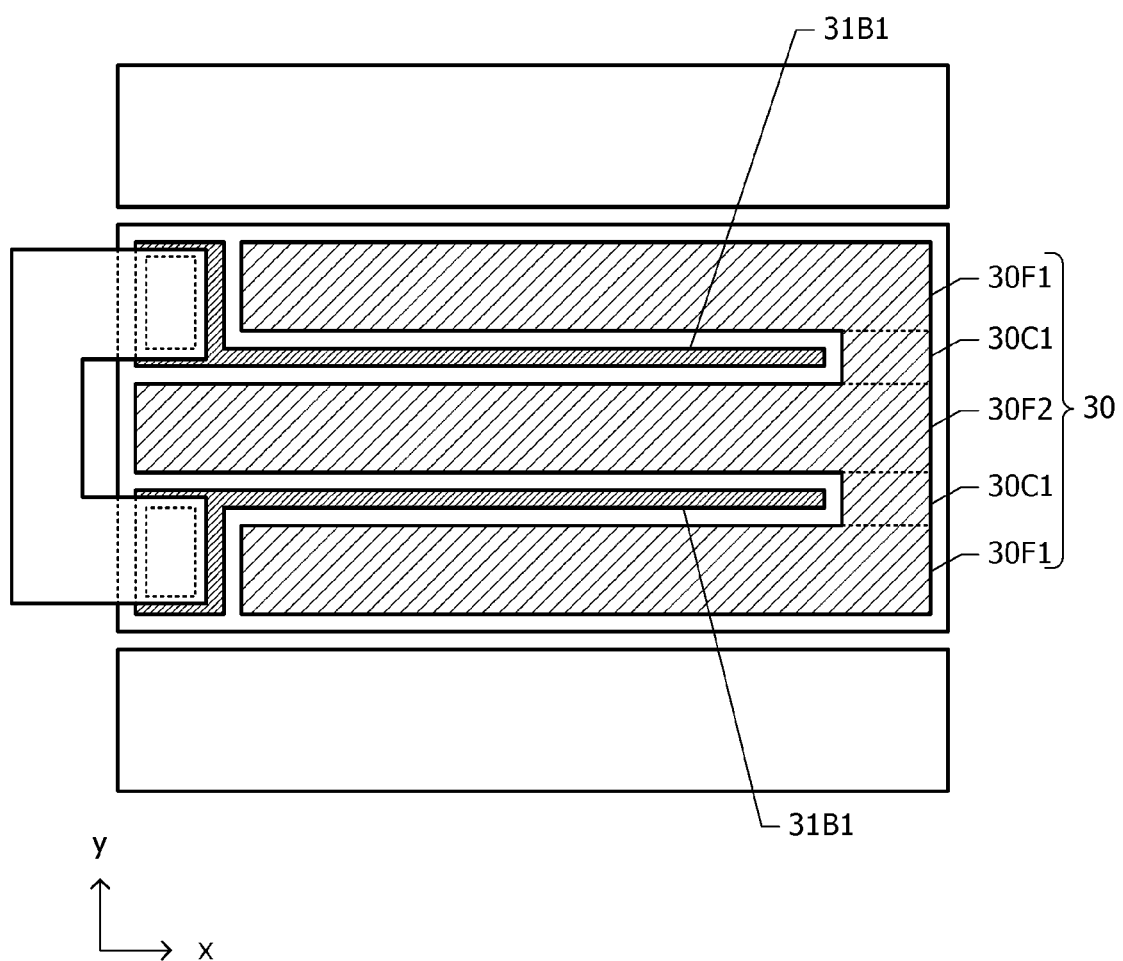
FIG. 11 is a diagram illustrating the planar positional relationship between the constituent elements of a bipolar transistor according to a seventh embodiment.

FIG. 11 is a diagram illustrating the planar positional relationship between the constituent elements of the bipolar transistor according to the seventh embodiment. In the third embodiment, the first base electrode portions 31B1 are arranged on both sides of each first emitter fingers 30F1. In contrast, in the seventh embodiment, the first base electrode portions 31B1 are arranged only between the first emitter fingers 30F1 and the second emitter finger 30F2 and the first base electrode portions 31B1 are not arranged outside the first emitter fingers 30F1.

Next, advantageous effects of the seventh embodiment will be described.

Since the outermost first base electrode portions 31B1 of the third embodiment (FIG. 7) are not arranged in the seventh embodiment, the area of the base mesa 25 can be reduced while maintaining the area of the emitter mesa 30 as it is. As a result, the base-collector junction capacitance Cbc can be reduced.

However, in the seventh embodiment, since the first base electrode portions 31B1 are not arranged outside the first emitter fingers 30F1, the base resistance Rb is larger than in the third embodiment (FIG. 7).

In the case where the contribution of the increase in the base resistance Rb to an increase or decrease in the maximum oscillation frequency $f_{max}$ is smaller than the contribution of the reduction in the base-collector junction capacitance Cbc to the increase or decrease in the maximum oscillation frequency $f_{max}$, the radio-frequency characteristics are improved.

Next, a modification of the seventh embodiment will be described. In the seventh embodiment, the two first emitter fingers 30F1 and the one second emitter finger 30F2 are connected to each other by the emitter connection portions 30C1, but the emitter connection portions 30C1 do not have to be provided, as in the first embodiment (FIG. 1). In this case, the first base electrode portions 31B1 are preferably arranged so as to extend along the entire lengths of the first emitter fingers 30F1 in the longitudinal direction. Furthermore, the first base electrode portions 31B1 and the second base electrode portions 31B2 are preferably arranged so as to extend along then entire length of the second emitter finger 30F2 in the longitudinal direction.

In addition, the widths (dimension in the y-axis direction) of the first emitter fingers 30F1 arranged at both ends in the y-axis direction are preferably made smaller than the width of the second emitter finger 30F2 arranged in the center. With this configuration, it is possible to suppress an increase in the base resistance Rb caused by the first base electrode portions 31B1 not being arranged at the sides of the first emitter fingers 30F1.

Eighth Embodiment

Next, a bipolar transistor according to an eighth embodiment will be described while referring to FIG. 12. Hereafter, description of the parts of the configuration that are common to the bipolar transistor according to the first embodiment (FIGS. 1 to 3) will be omitted.

Figure 12:
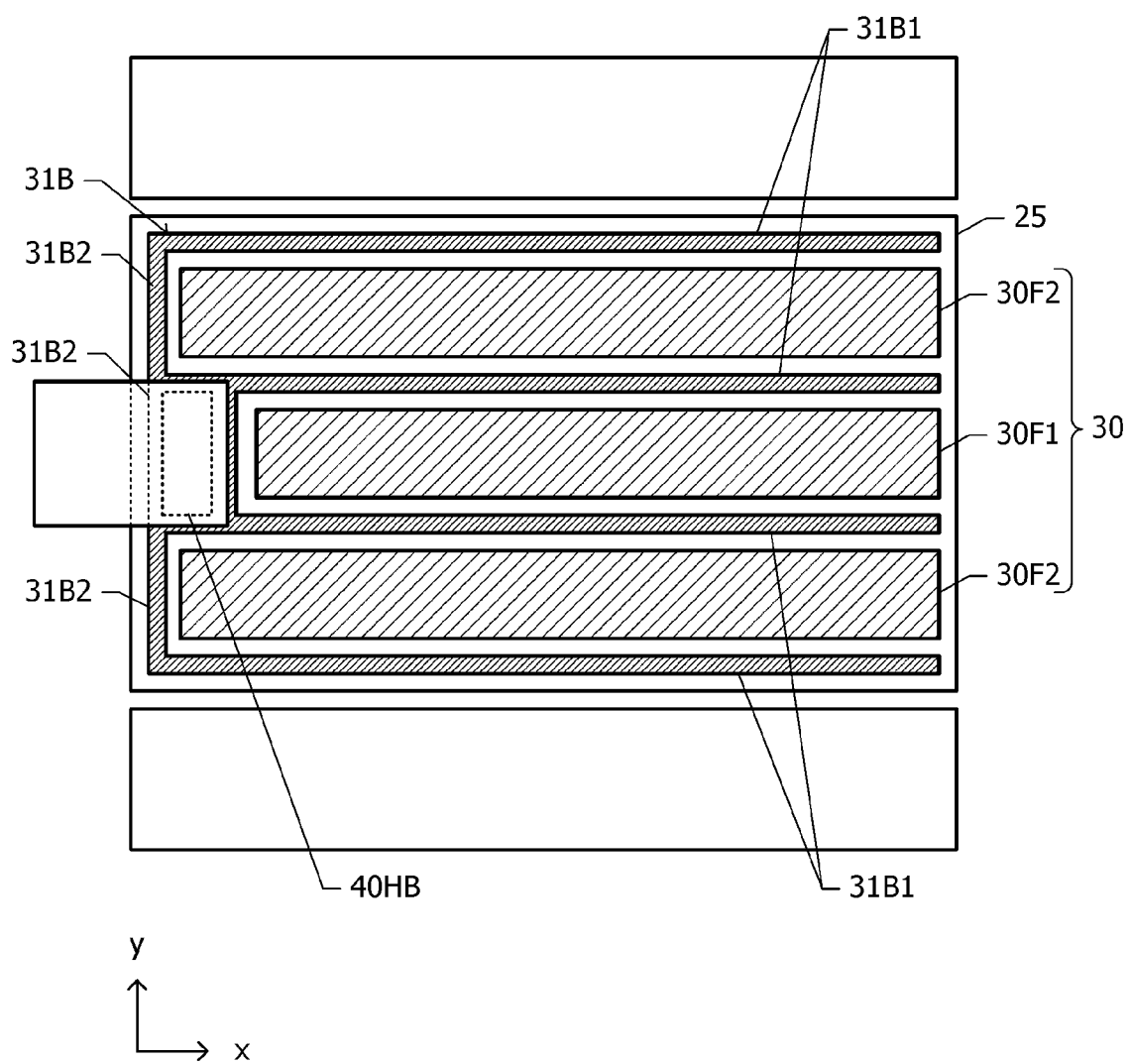
FIG. 12 is a diagram illustrating the planar positional relationship between the constituent elements of a bipolar transistor according to an eighth embodiment.

FIG. 12 is a diagram illustrating the planar positional relationship between the constituent elements of the bipolar transistor according to the eighth embodiment. In the first embodiment (FIG. 1), one second emitter finger 30F2 is arranged between two first emitter fingers 30F1. In contrast, in the eighth embodiment, one first emitter finger 30F1 is arranged between two second emitter fingers 30F2.

The base electrode 31B has a substantially comb-shaped planar shape, the first base electrode portions 31B1 thereof corresponding to the comb teeth and the second base electrode portions 31B2 corresponding to connection parts that connect the comb teeth to each other. A plurality of emitter fingers 30F are arranged between the first base electrode portions 31B1. At least one of the plurality of emitter fingers 30F is a first emitter finger 30F1 and the remaining emitter fingers 30F are second emitter fingers 30F2.

In other words, the first base electrode portions 31B1 are arranged between the second emitter fingers 30F2 and the first emitter finger 30F1, and outside the two second emitter fingers 30F2. Three second base electrode portions 31B2 connect the four first base electrode portions 31B1 to each other at the negative x-axis side end portions thereof. A base opening 40HB is arranged inside a second base electrode portion 31B2 that intersects a region obtained by virtually extending the first emitter finger 30F1 toward the negative x-axis side. Base openings 40HB are not arranged inside second base electrode portions 31B2 that intersect regions obtained by virtually extending the two second emitter finger 30F2 toward the negative x-axis side.

The y-axis direction dimensions of the second base electrode portions 31B2 in which base openings 40HB are not arranged are smaller than the y-axis direction dimension of the second base electrode portion 31B2 in which the base opening 40HB is arranged. End portions of the second emitter fingers 30F2 on the negative x-axis side extend further toward the negative x-axis side than the end portion of the first emitter finger 30F1 on the negative x-axis side. It is preferable that the second emitter fingers 30F2 extend toward the negative x-axis side so that the second emitter fingers 30F2 would overlap the base opening 40HB if virtually extended in the y-axis direction.

Next, advantageous effects of the eighth embodiment will be described.

Compared with the comparative example illustrated in FIG. 4, in the eighth embodiment, the area of the emitter mesa 30 can be increased without changing the area of the base mesa 25. Therefore, the base-collector junction capacitance Cbc can be substantially reduced.

Next, a modification of the eighth embodiment will be described.

In the eighth embodiment, two second emitter fingers 30F2 are arranged inside one base mesa 25, but alternatively one or three or more second emitter fingers 30F2 may be arranged inside one base mesa 25. It is sufficient that at least one first emitter finger 30F1 be arranged. Furthermore, the order in which the first emitter finger 30F1 and the second emitter finger 30F2 are arranged in the y-axis direction is not limited to the order illustrated in the eighth embodiment.

Each of the above-described embodiments is an illustrative example and it goes without saying that parts of the configurations illustrated in different embodiments can be substituted for one another or combined with each other. The same operational effects resulting from the same configurations in a plurality of embodiments are not repeatedly described in the individual embodiments. In addition, the present disclosure is not limited to the above-described embodiments. For example, it will be clear to a person skilled in the art that various changes, improvements, and combinations are possible.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A bipolar transistor comprising:
   a substantially mesa-shaped base mesa that is arranged on a substrate and includes semiconductor layers that form a collector and a base;
   a substantially mesa-shaped emitter mesa that is arranged on the base mesa and defines, in a plan view, an emitter region that operates as an emitter;
   a base electrode that is arranged so as to not overlap the emitter mesa in a plan view and that is ohmically connected to the base;
   an insulating film that covers the base electrode and in which at least one base opening is provided that is arranged inside the base electrode in a plan view; and
   a base wiring line that is arranged on the insulating film and is connected to the base electrode via the base opening;
   wherein
   the emitter mesa includes a plurality of emitter fingers that each have a planar shape that is long in one direction, and the emitter fingers are arranged side by side in a lateral direction, which is perpendicular to longitudinal directions of the emitter fingers, so that the longitudinal directions of the emitter fingers are parallel to each other, the emitter fingers include at least one first emitter finger and at least one second emitter finger, the base electrode includes at least one first base electrode portion that is arranged between the first emitter finger and the second emitter finger and is long in the longitudinal direction, and at least one second base electrode portion that is spaced apart in the longitudinal direction from one end portion of the first emitter finger, the base opening is arranged spaced apart in the longitudinal direction from the one end portion of the first emitter finger and is not arranged in a region obtained by extending the second emitter finger in the longitudinal direction in a plan view, and an end portion of the second emitter finger that is near the base opening protrudes in the longitudinal direction beyond an end portion of the first emitter finger that is near the base opening.

2. The bipolar transistor according to claim 1, wherein the end portion of the second emitter finger that is near the base opening extends in the longitudinal direction up to a position at which the second emitter finger would overlap the base opening if the second emitter finger were moved in a translational manner in the lateral direction.

3. The bipolar transistor according to claim 1, wherein two of the first emitter fingers are arranged and the second emitter finger is arranged between the two first emitter fingers, the first base electrode portions are arranged on both sides of each first emitter finger in the lateral direction, the first base electrode portions arranged on both sides of each first emitter fingers in the lateral direction are connected to each other by respective second base electrode portions, the base openings are arranged spaced apart in the longitudinal direction from the end portions of the two first emitter fingers that are near the base openings, and the base electrode is not arranged in a region obtained by extending the second emitter finger parallel to the longitudinal direction toward the base openings.

4. The bipolar transistor according to claim 3, wherein the emitter mesa includes emitter connection portions that connect the emitter fingers to each other at end portions thereof on a side opposite from a side near the base openings.

5. The bipolar transistor according to claim 4, wherein the emitter mesa includes emitter protruding portions that protrude in the lateral direction from end portions of the first emitter fingers that are on an opposite side from a side near the base openings, and the emitter protruding portions protrude up to a position where the first base electrode portions are arranged with respect to the lateral direction.

6. The bipolar transistor according to claim 4, wherein the base electrode includes a third base electrode portion that connects, to each other, end portions of the first base electrode portions that are arranged outside the first emitter fingers in the lateral direction, the end portions of the first base electrode portions being on an opposite side from a side near the base openings.

7. The bipolar transistor according to claim 3, wherein the base electrode includes a fourth base electrode portion that connects, to each other, the first base electrode portions that are arranged on both sides of the second emitter finger in the lateral direction, the fourth base electrode portion is arranged spaced apart in the longitudinal direction from an end portion of the second emitter finger that is on an opposite side from a side near the base openings, end portions of the first emitter fingers that are on an opposite side from a side near the base openings extend in longitudinal direction beyond a position where the fourth base electrode portion is arranged, and the emitter mesa includes an emitter connection portion that connects the first emitter fingers to each other at a position that is located further away in the longitudinal direction than the fourth base electrode portion when viewed from the base openings.

8. The bipolar transistor according to claim 1, wherein the base electrode has a substantially comb-shaped planar shape, the first base electrode portions thereof corresponding to the comb teeth and the second base electrode portions corresponding to connection parts that connect the comb teeth to each other, a plurality of the emitter fingers are arranged between the first base electrode portions, and at least one of the plurality of emitter fingers is the first emitter finger and the remaining emitter fingers are the second emitter fingers.

9. The bipolar transistor according to claim 2, wherein two of the first emitter fingers are arranged and the second emitter finger is arranged between the two first emitter fingers, the first base electrode portions are arranged on both sides of each first emitter finger in the lateral direction, the first base electrode portions arranged on both sides of each first emitter fingers in the lateral direction are connected to each other by respective second base electrode portions, the base openings are arranged spaced apart in the longitudinal direction from the end portions of the two first emitter fingers that are near the base openings, and the base electrode is not arranged in a region obtained by extending the second emitter finger parallel to the longitudinal direction toward the base openings.

10. The bipolar transistor according to claim 9, wherein the emitter mesa includes emitter connection portions that connect the emitter fingers to each other at end portions thereof on a side opposite from a side near the base openings.

11. The bipolar transistor according to claim 10, wherein the emitter mesa includes emitter protruding portions that protrude in the lateral direction from end portions of the first emitter fingers that are on an opposite side from a side near the base openings, and the emitter protruding portions protrude up to a position where the first base electrode portions are arranged with respect to the lateral direction.

12. The bipolar transistor according to claim 10, wherein the base electrode includes a third base electrode portion that connects, to each other, end portions of the first base electrode portions that are arranged outside the first emitter fingers in the lateral direction, the end portions of the first base electrode portions being on an opposite side from a side near the base openings.

13. The bipolar transistor according to claim 9, wherein the base electrode includes a fourth base electrode portion that connects, to each other, the first base electrode portions that are arranged on both sides of the second emitter finger in the lateral direction, the fourth base electrode portion is arranged spaced apart in the longitudinal direction from an end portion of the second emitter finger that is on an opposite side from a side near the base openings, end portions of the first emitter fingers that are on an opposite side from a side near the base openings extend in longitudinal direction beyond a position where the fourth base electrode portion is arranged, and the emitter mesa includes an emitter connection portion that connects the first emitter fingers to each other at a position that is located further away in the longitudinal direction than the fourth base electrode portion when viewed from the base openings.

14. The bipolar transistor according to claim 2, wherein the base electrode has a substantially comb-shaped planar shape, the first base electrode portions thereof corresponding to the comb teeth and the second base electrode portions corresponding to connection parts that connect the comb teeth to each other, a plurality of the emitter fingers are arranged between the first base electrode portions, and at least one of the plurality of emitter fingers is the first emitter finger and the remaining emitter fingers are the second emitter fingers.

* * * * *